(12) United States Patent
Chuang et al.

(10) Patent No.: US 9,418,948 B2
(45) Date of Patent: Aug. 16, 2016

(54) METHOD OF MAKING BOND PAD

(71) Applicant: TAIWAN SEMICONDUCTOR MANUFACTURING COMPANY, LTD., Hsinchu (TW)

(72) Inventors: Chiang-Ming Chuang, Changhua (TW); Chun Che Huang, Tainan (TW); Shih-Chieh Chang, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/869,012

(22) Filed: Sep. 29, 2015

(65) Prior Publication Data
US 2016/0020183 A1    Jan. 21, 2016

Related U.S. Application Data

(60) Continuation of application No. 14/330,473, filed on Jul. 14, 2014, now Pat. No. 9,252,109, which is a division of application No. 13/343,940, filed on Jan. 5, 2012, now Pat. No. 8,796,851.

(51) Int. Cl.
*H01L 21/44* (2006.01)
*H01L 23/00* (2006.01)
(52) U.S. Cl.
CPC .............. *H01L 24/03* (2013.01); *H01L 24/05* (2013.01); *H01L 2224/02166* (2013.01); *H01L 2224/05124* (2013.01); *H01L 2224/05186* (2013.01); *H01L 2224/05624* (2013.01); *H01L 2924/01013* (2013.01); *H01L 2924/0132* (2013.01); *H01L 2924/12042* (2013.01)

(58) Field of Classification Search
CPC .................................. H01L 24/05; H01L 24/03
USPC ........................................................... 257/751
See application file for complete search history.

(56) References Cited

U.S. PATENT DOCUMENTS

| 4,460,618 | A  | 7/1984  | Heinecke et al. |
| 5,175,125 | A  | 12/1992 | Wong |
| 5,981,382 | A  | 11/1999 | Konecni et al. |
| 6,723,628 | B2 | 4/2004  | Matsumoto et al. |
| 2005/0191836 | A1 | 9/2005 | Tzeng et al. |
| 2007/0218686 | A1 | 9/2007 | Wang et al. |

*Primary Examiner* — Elias M Ullah
(74) *Attorney, Agent, or Firm* — Hauptman Ham, LLP

(57) ABSTRACT

A method of making a bonding pad for a semiconductor device includes depositing a first region of the bonding pad on a top metal of the semiconductor device at a first temperature, wherein the first region comprises aluminum, and an entirety of a material of the first region of the bonding pad is different from a material of the top metal. The method further includes depositing a second region of the bonding pad on the first region at a second temperature, wherein the first temperature is different from the second temperature, and the second region is a metallic region.

20 Claims, 2 Drawing Sheets

METHOD OF MAKING BOND PAD

PRIORITY CLAIM

The present application is a continuation of U.S. application Ser. No. 14/330,473, filed Jul. 14, 2014, which is a divisional of U.S. application Ser. No. 13/343,940, filed Jan. 5, 2012, now U.S. Pat. No. 8,796,851, issued Aug. 5, 2014, which are incorporated herein by reference in their entireties.

BACKGROUND

Bonding pads are interfaces to connect the electric components inside a semiconductor device to exterior devices. Bonding pads electrically connect to components inside the semiconductor device by filling vias etched into the semiconductor device. Bonding pads electrically connect to exterior devices by accepting conductive connectors such as solder balls or wires which are electrically connected to exterior devices.

In order for a bonding pad to be effective, the bonding pad must completely fill the via, otherwise electrical connection to components inside the semiconductor device is not properly established. The bonding pad must also be strong enough to withstand the impact of wire bonding or pressing of another semiconductor device against a solder ball.

Conventional techniques use aluminum as a material for the bonding pad. The aluminum bonding pad is deposited in one process step using physical vapor deposition. Obtaining acceptable strength and via filling is difficult because the deposition process is a single step. High temperature physical vapor deposition provides better via filling but has poor strength which can cause the bonding pad to fracture upon impact when connecting to exterior devices. In the case of wire bonding, if the bonding pad is not strong enough the wire may pull out of the bonding pad during the wire bonding process. Low temperature physical vapor deposition provides high enough strength to withstand the impact of connecting to exterior devices but provides poor via filling.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DESCRIPTION

The following disclosure provides many different embodiments, or examples, for implementing different features of the invention. Specific examples of components and arrangements are described below to simplify the present disclosure. These are of course, merely examples and are not intended to be limiting. For example, the formation of a first feature over or on a second feature in the description that follows includes embodiments in which the first and second features are formed in direct contact, and also includes embodiments in which additional features are formed between the first and second features.

Figure 1:
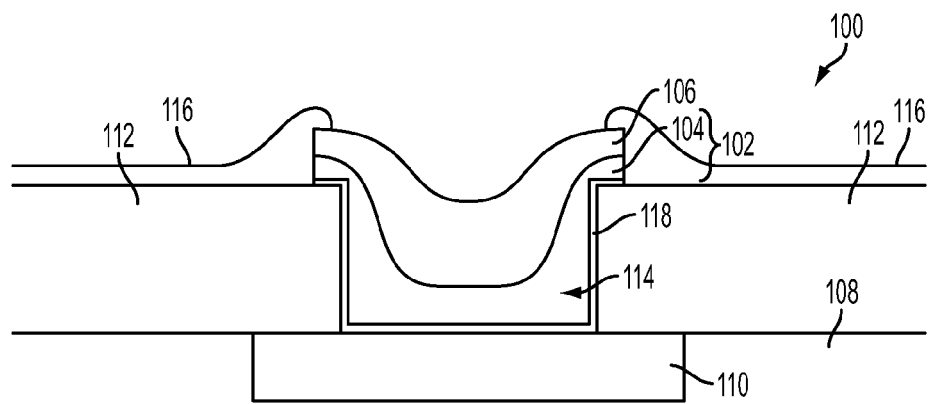
FIG. 1 is a side view diagram of a bonding pad according to some embodiments.

FIG. 1 is a side view diagram of a semiconductor device 100 including a bonding pad 102 having two regions 104 and 106 formed during two different deposition processes. Semiconductor device 100 comprises a top metal dielectric layer 108 having a top metal 110 formed thereon. In some embodiments, the top metal 110 is a metal line, via, interconnect, or similar conductive structure. In some embodiments, the top metal 110 is formed from a material comprising one of copper, titanium, or tungsten or other suitable conductive material. A buffer layer 118 is over top metal 110. A first passivation layer 112 is formed over the top metal dielectric layer 108 and over the top metal 110. In some embodiments, first passivation layer 112 is formed from a material comprising one of silicon oxide, silicon nitride, borophosphosilicate glass, a low k dielectric material such as aerogel, or other suitable dielectric material. In some embodiments, a second passivation layer 116 is over first passivation layer 112.

In some embodiments, bonding pad 102 has a thickness ranging from 50 nm to 20 µm. In some embodiments, second bonding pad region 106 has a thickness greater than 10 nm.

In some embodiments, top metal dielectric layer 108 has a top surface on substantially a same plane as a top surface of top metal 110. In some embodiments, top metal dielectric layer 108 and top metal 110 are planarized with a chemical mechanical planarization process so the top surface of each of top metal dielectric layer 108 and top metal 110 are on substantially the same plane.

In some embodiments, first passivation layer 112 comprises a single layer. In some embodiments, first passivation layer 112 comprises multiple layers. In some embodiments, first passivation layer comprises silicon nitride, silicon dioxide, silicon oxynitride, or other suitable materials.

A via 114 is formed in first passivation layer 112 using an etching process. In some embodiments, via 114 is formed by wet etching, dry etching, or reactive ion plasma etching, or other suitable etching process. Via 114 is an opening in first passivation layer 112 used to establish an electrical connection between top metal 110 and bonding pad 102.

In some embodiments, second passivation layer 116 comprises a single layer. In some embodiments, second passivation layer 116 comprises multiple layers. In some embodiments, second passivation layer comprises silicon nitride, silicon dioxide, silicon oxynitride, or other suitable materials.

Buffer layer 118 is between top metal 110 and first bonding pad region 104 and prevents cross-diffusion of materials between top metal 110 and first bonding pad region 104. In some embodiments, buffer layer 118 comprises tantalum nitride, titanium nitride, or other suitable materials. In some embodiments, buffer layer 118 extends up sidewalls of first passivation layer 112 to prevent material from first bonding pad region 104 from diffusing into first passivation layer 112.

A first bonding pad region 104 fills the via 114 etched into semiconductor device 100 and forms an electrical connection with top metal 110. A second bonding pad region 106 is deposited on top of first bonding pad region 104 and is electrically connected to top metal 110 through first bonding pad region 104. In some embodiments, first bonding pad region 104 and second bonding pad region 106 are aluminum. In other embodiments, first bonding pad region 104 and second bonding pad region 106 are aluminum-copper alloys. In still other embodiments, first bonding pad region 104 is a different material than second bonding pad region 106.

Figure 3A:
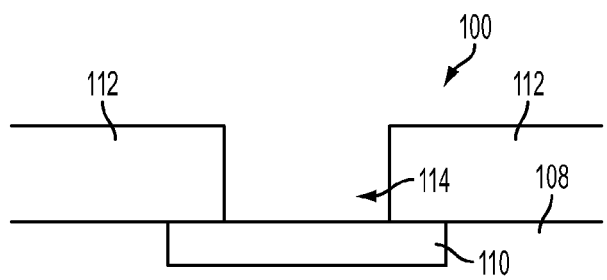
FIGS. 3A and 3B are side view diagrams of a bonding pad at various stages of development according to some embodiments.
Figure 2:
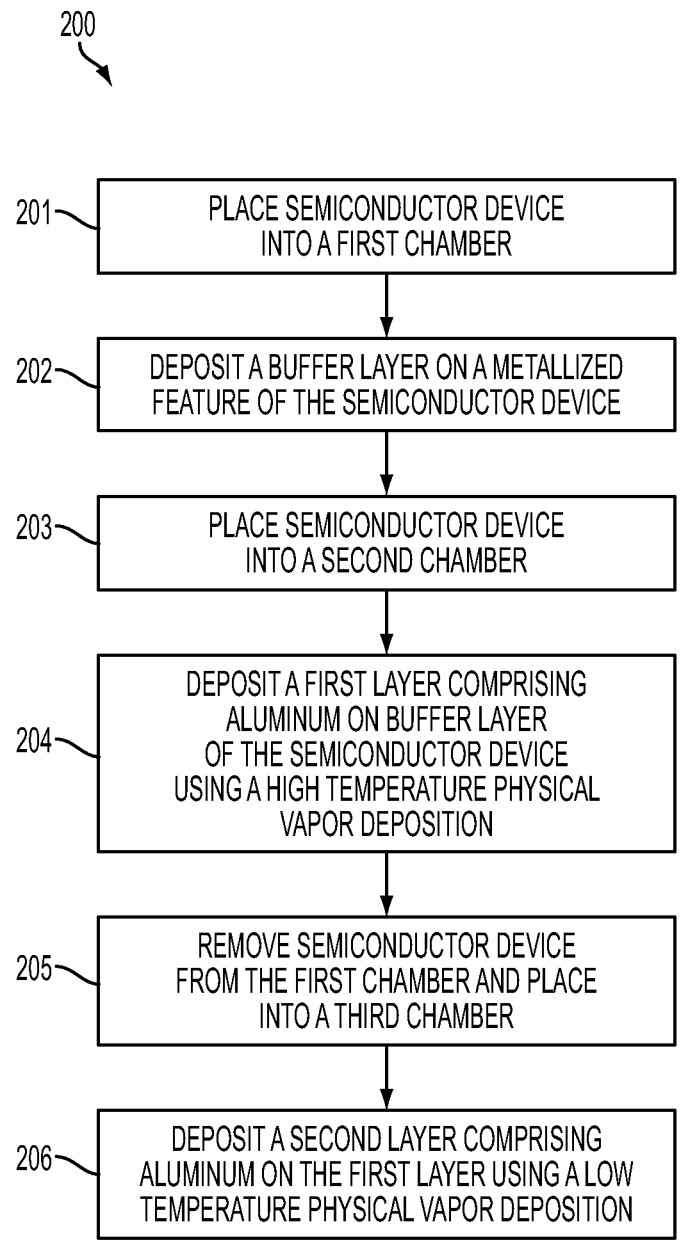
FIG. 2 is a flow chart of a method of making the bonding pad of FIG. 1 according to some embodiments.

FIG. 2 is a flow diagram of at least a portion of a method 200 of forming the bonding pad of FIG. 1 according to some embodiments. Method 200 begins with step 201 in which semiconductor device 100 is placed into a first deposition chamber. At this point in the process, semiconductor device 100 has via 114 formed in first passivation layer 112 and top metal 110 on top metal dielectric layer 108, but no buffer layer and bonding pad regions, as shown in FIG. 3A. The flow then proceeds to step 202.

In step 202, buffer layer 118 is deposited in via 114 to prevent top metal 110 and bonding pad 102 inter-diffusion. In step 203, semiconductor device 100 is placed into a second deposition chamber.

Figure 3B:
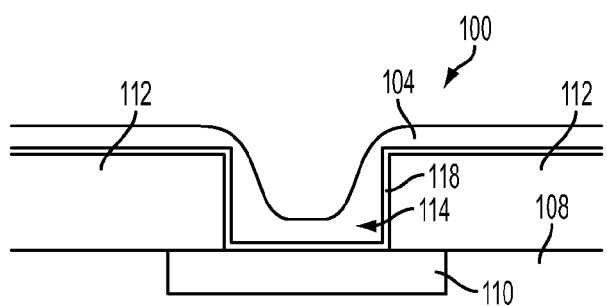

In step 204, first bonding pad region 104 is deposited on the semiconductor device 100 to fill via 114 and electrically connect the first bonding pad region 104 to top metal 110, forming the structure shown in FIG. 3B. In the embodiment of FIGS. 1-3B, the deposition process is physical vapor deposition. In some embodiments, the physical vapor deposition process entails sputtering, evaporative deposition, pulsed laser deposition or other physical deposition methods. In an embodiment, the physical vapor deposition process occurs at a temperature in a range from about 300° C. to about 450° C. In the embodiment of FIGS. 1-3B, first bonding pad region 104 has an average grain size of about 2.0 µm to about 4.0 µm. The high temperature of the deposition process forms a region, i.e., first bonding pad region 104, having via filling characteristics sufficient to provide reliable electrical connection to top metal 110. The flow then proceeds to step 205.

In step 205, the semiconductor device having first bonding pad region 104 deposited thereon is removed from the first deposition chamber and placed in a third deposition chamber. In some embodiments, first bonding pad region 104 and second bonding pad region 106 are deposited in the same deposition chamber.

In step 206, second bonding pad region 106 is deposited on first bonding pad region 104 using physical vapor deposition. In some embodiments, the physical vapor deposition process entails sputtering, evaporative deposition, pulsed laser deposition or other physical deposition methods. In at least some embodiments, the physical vapor deposition process occurs at a temperature ranging from about 150° C. to about 300° C. In the embodiments of FIGS. 1-3B, second bonding pad 106 has an average grain size of about 0.1 µm to about 2.0 µm. The low temperature of the deposition process forms a region having a sufficient surface hardness to withstand the impact of connecting the semiconductor device to exterior devices. Second bonding pad region 106 is electrically connected to top metal 110 through contact with first bonding pad region 104. An etching process is then used to define the edges of first boning pad region 104, second bonding pad region 106 and buffer layer 118.

In some embodiments, first bonding pad region 104 and second bonding pad region 106 are deposited in a single process with a varying temperature. In some embodiments, an initial temperature at a beginning of the single process is substantially the same as the deposition temperature of first bonding pad region 104. In some embodiments, a final temperature at an end of the single process is substantially the same as the deposition temperature of second bonding pad region 106. In some embodiments, the transition from the initial temperature to the final temperature is a step-wise increase. In some embodiments, the transition from the initial temperature to the final temperature is a continuous increase.

In some embodiments, the average grain size of first bonding pad region 104 is larger than the average grain size of second bonding pad region 106. In some embodiments, the average grain size of first bonding pad region 104 is at least about 1.5 times larger than the average grain size of second bonding pad region 106. The average grain size of the region has a positive relationship with the deposition temperature, i.e., as the deposition temperature increases, the grain size increases.

One aspect of the description relates to a method of making a bonding pad for a semiconductor device. The method includes depositing a first region of the bonding pad on a top metal of the semiconductor device at a first temperature, wherein the first region comprises aluminum, and an entirety of a material of the first region of the bonding pad is different from a material of the top metal. The method further includes depositing a second region of the bonding pad on the first region at a second temperature, wherein the first temperature is different from the second temperature, and the second region is a metallic region.

Another aspect of this description relates to a method of making a bonding pad for a semiconductor device. The method includes forming a passivation layer over a dielectric layer, wherein the passivation layer defines an opening exposing at least a portion of a top metal layer. The method further includes depositing a first region over the top metal layer, the first region comprising aluminum and having a first average grain size. The method further includes depositing a second region over the first region, the second region comprising aluminum, wherein the second region has a second average grain size different from the first average grain size, and the first region and the second region extend along a top surface of the passivation layer.

Still another aspect of this description relates to a method of making a bonding pad for a semiconductor device. The method includes forming a passivation layer over a dielectric layer. The method further includes etching the passivation layer to form an opening exposing at least a portion of a top metal layer. The method further includes depositing an aluminum-containing layer in the opening and over a top surface of the passivation layer, wherein depositing the aluminum-containing layer comprises continuously decreasing a temperature from an initial deposition temperature to a final deposition temperature, and a first average grain size of the aluminum-containing layer closest to the top metal layer is different from a second average grain size of the aluminum-containing layer farthest from the top metal layer.

While the description is presented by way of examples and in terms of specific embodiments, it is to be understood that the invention is not limited to the disclosed embodiments. To the contrary, it is intended to cover various modifications and similar arrangements (as would be apparent to those skilled in the art). The above description discloses exemplary steps, but they are not necessarily required to be performed in the order described. Steps can be added, replaced, change in order, and/or eliminated as appropriate, in accordance with the spirit and scope of the description. Embodiments that combine different claims and/or different embodiments are within the scope of the description and will be apparent to those skilled in the art after reviewing this disclosure. Therefore, the scope of the appended claims should be accorded the broadest interpretation so as to encompass all such modifications and similar arrangements.

The invention claimed is:
1. A method of making a bonding pad for a semiconductor device, the method comprising:
depositing a first region of the bonding pad on a top metal of the semiconductor device at a first temperature, wherein the first region comprises aluminum, and an entirety of a material of the first region of the bonding pad is different from a material of the top metal; and depositing a second region of the bonding pad on the first region at a second temperature, wherein the first temperature is different from the second temperature, and the second region is a metallic region.

2. The method of claim 1, wherein the first temperature is higher than the second temperature.

3. The method of claim 1, wherein the first region is deposited at a temperature ranging from 300° C. to 400° C.

4. The method of claim 1, wherein the second region is deposited at a temperature ranging from 150° C. to 300° C.

5. The method of claim 1, wherein the first region is deposited in a first chamber and the second region is deposited in a second chamber, wherein the first chamber is different from the second chamber.

6. The method of claim 1, wherein steps of depositing the first region and depositing the second region are performed using physical vapor deposition.

7. The method of claim 1, wherein depositing the second region comprises depositing a material different from the material of the first region.

8. The method of claim 1, wherein depositing the first region comprises depositing an aluminum-copper alloy.

9. A method of making a bonding pad for a semiconductor device, the method comprising:

forming a passivation layer over a dielectric layer, wherein the passivation layer defines an opening exposing at least a portion of a top metal layer;

depositing a first region over the top metal layer, the first region comprising aluminum and having a first average grain size; and depositing a second region over the first region, the second region comprising aluminum, wherein the second region has a second average grain size different from the first average grain size, and the first region and the second region extend along a top surface of the passivation layer.

10. The method of claim 9, further comprising forming a buffer layer over the bonding pad, wherein the buffer layer is between the bonding pad and the first region.

11. The method of claim 10, wherein forming the buffer layer comprises lining sidewalls of the passivation layer.

12. The method of claim 9, further comprising etching the passivation layer to define the opening.

13. The method of claim 9, further comprising forming a second passivation layer over a portion of the second region.

14. The method of claim 9, wherein depositing the second region comprises depositing the second region in a same process as depositing the first region, wherein the first region is deposited at a first temperature of the process, the second region is deposited at a second temperature of the process, and a change from the first temperature to the second temperature is a step-wise change.

15. The method of claim 9, wherein depositing the second region comprise depositing the second region having the second average grain size at least about 1.5 times smaller than the first average grain size.

16. A method of making a bonding pad for a semiconductor device, the method comprising:

forming a passivation layer over a dielectric layer;

etching the passivation layer to form an opening exposing at least a portion of a top metal layer; and depositing an aluminum-containing layer in the opening and over a top surface of the passivation layer, wherein depositing the aluminum-containing layer comprises continuously decreasing a temperature from an initial deposition temperature to a final deposition temperature, and a first average grain size of the aluminum-containing layer closest to the top metal layer is different from a second average grain size of the aluminum-containing layer farthest from the top metal layer.

17. The method of claim 16, wherein depositing the aluminum-containing layer comprises depositing an aluminum-copper alloy.

18. The method of claim 16, wherein depositing the aluminum-containing layer comprises depositing the aluminum-containing layer at the initial deposition temperature ranging from about 300° C. to about 450° C.

19. The method of claim 16, wherein depositing the aluminum-containing layer comprises depositing the aluminum-containing layer at the final deposition temperature ranging from about 150° C. to about 300° C.

20. The method of claim 16, wherein depositing the aluminum-containing layer comprises sputtering, evaporative deposition or pulsed laser deposition.

* * * * *